United States Patent [19]

Raghavachari

[11] Patent Number: 5,311,520
[45] Date of Patent: May 10, 1994

[54] METHOD AND APPARATUS FOR PROGRAMMABLE MEMORY CONTROL WITH ERROR REGULATION AND TEST FUNCTIONS

[75] Inventor: Partha Raghavachari, Chicago, Ill.

[73] Assignee: AT&T Bell Laboratories, Murray Hill, N.J.

[21] Appl. No.: 752,115

[22] Filed: Aug. 29, 1991

[51] Int. Cl.⁵ ............................................. G11C 29/00
[52] U.S. Cl. ................................. 371/21.6; 371/21.2
[58] Field of Search .................. 371/21.1, 21.2, 21.3, 371/21.6, 22.1, 22.3, 22.5, 22.6, 27; 395/575

[56] References Cited

U.S. PATENT DOCUMENTS

| | | | |
|---|---|---|---|
| 4,757,503 | 7/1988 | Hayes et al. | 371/21.1 |
| 4,916,700 | 4/1990 | Ito et al. | 371/21.1 |
| 4,980,888 | 12/1990 | Bruce et al. | 371/21.1 |
| 5,016,220 | 5/1991 | Yamagata | 371/21.1 |
| 5,228,045 | 7/1993 | Chiles | 371/22.3 |
| 5,231,605 | 7/1993 | Lee | 371/21.2 |

OTHER PUBLICATIONS

M. Y. Hsiao, "A Class of Optimal Minimum Odd-weight-column SEC-DED Codes," *IBM J. Res. Develop.*, 395–401 (Jul. 1970).

*Primary Examiner*—Jack B. Harvey
*Assistant Examiner*—Edward Pipala
*Attorney, Agent, or Firm*—Robert B. Levy

[57] ABSTRACT

An electronic circuit (10) for controlling and testing up to eight banks (12) of RAMs ($14_1$–$14_n$) includes a controller portion (20) for controlling accessing of the RAM banks to permit read and write operations to be carried out, and for initiating testing of the RAMs as well. The circuit (10) also includes a data path portion (22) for detecting parity errors in the data written to and read from the RAMs as well as for detecting errors which occur during testing initiated by the control portion. An interface portion (24) may also be provided to allow test commands, status information and error data to be communicated to and from the circuit (10) across a four-wire boundary scan bus.

15 Claims, 17 Drawing Sheets

| REGISTER ARRAY | | | |
|---|---|---|---|
| REGISTER | ADDRESS (A31-A0) (HEX) | ACCESS MODE | |
| COMMAND REGISTER | XXXXX800 | RW | $46_1$ |
| STATUS REGISTER | XXXXX808 | RW | $46_2$ |
| ERROR ADDRESS REGISTER | XXXXX810 | RW | $46_3$ |
| STROBE SHAPE REGISTER | XXXXX818 | RW | $46_4$ |
| MARCH TEST REGISTER 0 | XXXXX840 | RW | $46_5$ |
| MARCH TEST REGISTER 1 | XXXXX848 | RW | $46_6$ |
| MARCH TEST REGISTER 2 | XXXXX850 | RW | $46_7$ |
| MARCH TEST REGISTER 3 | XXXXX858 | RW | $46_8$ |
| BANK ADDRESS BOUNDARY REGISTER 0 | XXXXX880 | RW | $46_9$ |
| BANK ADDRESS BOUNDARY REGISTER 1 | XXXXX888 | RW | $46_{10}$ |
| BANK ADDRESS BOUNDARY REGISTER 2 | XXXXX890 | RW | $46_{11}$ |
| BANK ADDRESS BOUNDARY REGISTER 3 | XXXXX898 | RW | $46_{12}$ |
| BANK ADDRESS BOUNDARY REGISTER 4 | XXXXX8C0 | RW | $46_{13}$ |
| BANK ADDRESS BOUNDARY REGISTER 5 | XXXXX8C8 | RW | $46_{14}$ |
| BANK ADDRESS BOUNDARY REGISTER 6 | XXXXX8D0 | RW | $46_{15}$ |
| BANK ADDRESS BOUNDARY REGISTER 7 | XXXXX8D8 | RW | $46_{16}$ |
| ERROR FLAGS REGISTER | XXXXX900 | RO | $46_{17}$ |

X = DON'T CARE; RW = READ OR WRITE; RO = READ ONLY

*FIG. 2*

| COMMAND REGISTER | | | |
|---|---|---|---|
| BIT NO. | DEFINITION | | VALUE AFTER RESET |
| 0 | RUN MEMORY ARRAY MARCH TEST | 0 = OFF<br>1 = ON | 0 |
| 8:1 | BANKS [7:0] ENABLE BITS FOR MARCH TEST | 0 = OFF<br>1 = ON | ALL 1'S |
| 9 | RUN MARCH TEST | 0 = TO COMPLETION<br>1 = STOP ON ERROR | 1 |
| 10 | PAGE MODE MEMORY COLUMN ADDRESS COMPLEMENT/INCREMENT | 0 = COMPLEMENT<br>1 = INCREMENT | 0 |
| 11 | RESERVED | | 0 |
| 13:12 | NO. OF MEMORY ACCESS (CAS) IN PAGE MODE OPERATION | 00 = 2<br>01 = 4<br>10 = 8<br>11 = 16 | 00 |
| 15:14 | ADDRESS QUEUE DEPTH | 00 = 1 DEEP<br>01 = 2 DEEP<br>10 = 3 DEEP<br>11 = 4 DEEP | 11 |
| 17:16 | REFRESH INTERVAL SELECTION | 00 = 376 CLOCKS<br>01 = 504 CLOCKS<br>1X = RESERVED | 00 |
| 18 | MEMORY ERROR SCRUBBING MODE FOR NORMAL READ OPERATIONS | 0 = ON<br>1 = OFF | 0 |
| 26:19 | STATUS OF BANKS [7:0] | 0 = IN SERVICE<br>1 = OUT OF SERVICE | ALL 0'S |
| 27 | RESERVED | | 0 |
| 28 | AUTOMATIC INTERNAL REFRESH GENERATION MODE | 0 = ON<br>1 = OFF | 0 |
| 29 | ODD/EVEN PARITY SELECTION FOR INPUT ADDRESS BUS | 0 = EVEN<br>1 = ODD | 0 |
| 30 | INPUT ADDRESS BUS PARITY CHECKING | 0 = OFF<br>1 = ON | 0 |
| 31 | RESERVED | | 0 |

*FIG. 3*

| STATUS REGISTER ||||
| --- | --- | --- | --- |
| BIT NO. | DEFINITION || VALUE ON POWER UP |
| 3:0 | TYPE FIELD || ALL X'S |
| 11:4 | BANKS [7:0] STATUS BITS | 0 = PRESENT<br>1 = ABSENT | ALL X'S |
| 13:12 | BANK 0 SIZE | 00 = 256K x 1 OR 256K x 4 DRAM<br>01 = 1M x 1 OR 1M x 4 DRAM<br>10 = 4M x 1 OR 4M x 4 DRAM<br>11 = 16M x 1 OR 16M x 4 DRAM | ALL X'S |
| 15:14 | BANK 1 SIZE || ALL X'S |
| 17:16 | BANK 2 SIZE || ALL X'S |
| 19:18 | BANK 3 SIZE || ALL X'S |
| 21:20 | BANK 4 SIZE || ALL X'S |
| 23:22 | BANK 5 SIZE || ALL X'S |
| 25:24 | BANK 6 SIZE || ALL X'S |
| 27:26 | BANK 7 SIZE || ALL X'S |
| 28 | CHIP VERSION || 0 |
| 31:29 | MARCH TEST FAULTY BANK INDICATION | 000 = BANK 0<br>001 = BANK 1<br>010 = BANK 2<br>011 = BANK 3<br>100 = BANK 4<br>101 = BANK 5<br>110 = BANK 6<br>111 = BANK 7 | ALL X'S |

X = UNKNOWN

*FIG. 4*

| MARCH TEST REGISTER ELEMENT ||| 46₅ |
|---|---|---|
| BIT NO. | DEFINITION ||
| 2:0 | NUMBER OF MARCH OPERATIONS | 000 = ZERO OPERATIONS<br>001 = ONE OPERATION<br>010 = TWO OPERATIONS<br>011 = THREE OPERATIONS<br>100 = FOUR OPERATIONS<br>101 = FIVE OPERATIONS<br>110 = SIX OPERATIONS<br>111 = SEVEN OPERATIONS |
| 3 | ADDRESS PROGRESSION | 0 = INCREASING ( > )<br>1 = DECREASING ( < ) |
| 5:4 | TYPE OF OPERATION (OPERATION 1) | 00 = WRITE DATA<br>01 = WRITE $\overline{DATA}$<br>10 = READ DATA<br>11 = READ $\overline{DATA}$ |
| 7:6 | TYPE OF OPERATION (OPERATION 2) ||
| 9:8 | TYPE OF OPERATION (OPERATION 3) ||
| 11:10 | TYPE OF OPERATION (OPERATION 4) ||
| 13:12 | TYPE OF OPERATION (OPERATION 5) ||
| 15:14 | TYPE OF OPERATION (OPERATION 6) ||
| 17:16 | TYPE OF OPERATION (OPERATION 7) ||

*FIG. 5*

| ERROR FLAG REGISTER 46₁₇ |||||
|---|---|---|---|
| BIT NO. | DEFINITION || VALUE AFTER ASSERTING RESET20 |
| 0 | MARCH TEST ERROR FLAG | 1 = ERROR<br>0 = NO ERROR | 0 |
| 1 | REFRESH ABORT ERROR FLAG | 1 = ERROR<br>0 = NO ERROR | 0 |
| 2 | BANK ERROR FLAG | 1 = ERROR<br>0 = NO ERROR | 0 |
| 3 | STATE MACHINE ERROR FLAG | 1 = ERROR<br>0 = NO ERROR | 0 |
| 4 | SINGLE BIT MEMORY ERROR FLAG | 1 = ERROR<br>0 = NO ERROR | 0 |
| 5 | MULTIPLE BIT MEMORY ERROR FLAG | 1 = ERROR<br>0 = NO ERROR | 0 |
| 6 | ADDRESS INPUT PARITY ERROR FLAG | 1 = ERROR<br>0 = NO ERROR | 0 |
| 7 | DATA INPUT PARITY ERROR FLAG | 1 = ERROR<br>0 = NO ERROR | 0 |
| 31:8 | RESERVED || ALL X'S |

*FIG. 6*

| OPCODE | OPERATION |
|---|---|
| 0000 | INITIALIZATION WRITE |
| 0001 | INITIALIZATION READ |
| 0010 | REGISTER ACCESS (I/O) WRITE |
| 0011 | REGISTER ACCESS (I/O) READ |
| 0100 | PARTIAL WRITE |
| 0101 | PARTIAL READ |
| 0110 | SINGLE WRITE |
| 0111 | SINGLE READ |
| 1000 | BURST (PAGE MODE) WRITE |
| 1001 | BURST (PAGE MODE) READ |
| 1010 | REFRESH (ERROR SCRUB) WRITE |
| 1011 | REFRESH (ERROR SCRUB) READ |
| 1100 | MARCH TEST WRITE DATA |
| 1101 | MARCH TEST READ DATA |
| 1110 | MARCH TEST WRITE $\overline{DATA}$ |
| 1111 | MARCH TEST READ $\overline{DATA}$ |

*FIG. 7*

| OPERATION | | STATE TRAVERSAL |
|---|---|---|
| INITIALIZATION: | | |
| A. READ | | sti → st0 → st1 → st2 → st2e → sti |
| B. WRITE | | sti → st0 → st1 → st2 → sti |
| I/O OPERATION: | | |
| MC REG ACCESS | A. WRITE | sti → st0 → st1 → st2 → st2e → ··· → st2e → sti |
| | B. READ | sti → st0 → st1 → ··· → st1 → st2 → st2e → sti |
| DP REG ACCESS | A. WRITE | sti → st0 → st1 → st2 → sti |
| | B. READ | sti → st0 → st1 → st2 → st2e → sti |
| PARTIAL: | | |
| A. READ (NO ERROR) | | sti → st0 → st1 → st2 → st2e → sti |
| B. READ (ERROR SCRUB) | | sti → st0 → st1 → st2 → st2e → st2c → sti |
| C. RMW (ERROR SCRUB) | | sti → st0 → st1 → st2 → st2e → st2c → sti |
| D. RMW (PARITY ERROR) | | sti → st0 → st1 → st2 → st2e → stD → sti |
| SINGLE: | | |
| A. READ | | sti → st0 → st1 → st2 → st2e → sti |
| B. READ (ERROR SCRUB) | | sti → st0 → st1 → st2 → st2e → st2c → sti |
| C. WRITE | | sti → st0 → st1 → st2 → sti |
| D. WRITE (PARITY ERROR) | | sti → st0 → st1 → stD → sti |
| PAGE MODE: | | |
| ADDRESS INTERLEAVE: | | |
| A. READ | | sti → st0 → st1 → st2 → st2e → st3 → st3e → st4 → st4e → st3 → st3e → st4 → st4e → ··· → st3 → st3e → sti |
| B. READ W/ ERROR SCRUB | | sti → st0 → st1 → st2 → st2e → st3 → st3e → st3c → stD → st4 → st4e → st3 → ··· → sti |
| C. WRITE | | sti → st0 → st1 → st2 → st2e → st3 → st3e → st4 → st4e → st3 → st3e → ··· → st3 → sti |
| D. WRITE (PARITY ERROR) | | sti → st0 → st1 → st2 → st2e → stD → sti |
| ADDRESS NON-INTERLEAVE: | | |
| A. READ | | sti → st0 → st1 → st2 → st2e → st4 → st4e → st4 → st4e → ··· → st4 → st4e → sti |
| B. READ W/ ERROR SCRUB | | sti → st0 → st1 → st2 → st2e → st4 → st4e → st4c → stD → st4 → st4e → ··· → st4e → sti |
| C. WRITE | | sti → st0 → st1 → st2 → st2e → st4 → st4e → st4 → st4e → ··· → st4e → st4 → sti |
| D. WRITE (PARITY ERROR) | | sti → st0 → st1 → st2 → st2e → st4 → st4e → stD → sti |
| REFRESH | | sti → st0 → st1 → sti |
| MARCH TEST: | | |
| A. WRITE | | sti → st0 → st1 → st2 ( → st2e → st4 → st4e → st4 → ··· → st4e → st4 ) → sti |
| B. READ | | sti → st0 → st1 → st2 → st2e ( → st4 → st4e → st4 → ··· → st4 → st4e )→ sti |

*FIG. 9*

| \multicolumn{4}{c|}{REGISTER ARRAY (66)} | |
|---|---|---|---|---|
| DP NO. | REGISTER | ADDRESS (A31–A0) (HEX) | ACCESS MODE | |
| 0 | COMMAND | XXXXXA00 | RW | $66_1$ |
| | STATUS | (XXXXXA10, XXXXXA18) | (RC, RS) | $66_2$ |
| | ERROR DATA | XXXXXA48 | RO | $66_3$ |
| 1 | COMMAND | XXXXXA84 | RW | $66_4$ |
| | STATUS | (XXXXXA94, XXXXXA9C) | (RC, RS) | $66_5$ |
| | ERROR DATA | XXXXXACC | RO | $66_6$ |
| 2 | COMMAND | XXXXXB00 | RW | $66_7$ |
| | STATUS | (XXXXXB10, XXXXXB18) | (RC, RS) | $66_8$ |
| | ERROR DATA | XXXXXB48 | RO | $66_9$ |
| 3 | COMMAND | XXXXXB84 | RW | $66_{10}$ |
| | STATUS | (XXXXXB94, XXXXXB9C) | (RC, RS) | $66_{11}$ |
| | ERROR DATA | XXXXXBCC | RO | $66_{12}$ |
| 4 | COMMAND | XXXXXE00 | RW | $66_{13}$ |
| | STATUS | (XXXXXE10, XXXXXE18) | (RC, RS) | $66_{14}$ |
| | ERROR DATA | XXXXXE48 | RO | $66_{15}$ |
| 5 | COMMAND | XXXXXE84 | RW | $66_{16}$ |
| | STATUS | (XXXXXE94, XXXXXE9C) | (RC, RS) | $66_{17}$ |
| | ERROR DATA | XXXXXECC | RO | $66_{18}$ |
| 6 | COMMAND | XXXXXF00 | RW | $66_{19}$ |
| | STATUS | (XXXXXF10, XXXXXF18) | (RC, RS) | $66_{20}$ |
| | ERROR DATA | XXXXXF48 | RO | $66_{21}$ |
| 7 | COMMAND | XXXXXF84 | RW | $66_{22}$ |
| | STATUS | (XXXXXF94, XXXXXF9C) | (RC, RS) | $66_{23}$ |
| | ERROR DATA | XXXXXFCC | RO | $66_{24}$ |

*FIG. 11*

| COMMAND REGISTER | | | |
|---|---|---|---|
| BIT NO. | DEFINITION | | VALUE ON RESET |
| 1:0 | WRITE DATA QUEUE DEPTH | 00 = 1 DEEP<br>01 = 2 DEEP<br>10 = 3 DEEP<br>11 = 4 DEEP | 11 |
| 3:2 | READ DATA QUEUE DEPTH | 00 = 1 DEEP<br>01 = 2 DEEP<br>10 = 3 DEEP<br>11 = 4 DEEP | 11 |
| 4 | WRITE DATA PARITY SELECTION | 0 = EVEN<br>1 = ODD | 0 |
| 5 | WRITE DATA PARITY CHECK | 0 = OFF<br>1 = ON | 0 |
| 6 | FORCE BAD PARITY ON SYSTEM BUS | 0 = OFF<br>1 = ON | 0 |
| 7 | INHIBIT ERROR CHECKING ON MEMORY | 0 = CHECK<br>1 = INHIBIT | 0 |
| 14:8 | FORCED CHECK BIT FIELD ON MEMORY (USED WHEN BIT 15 = 1) | | ALL 0'S |
| 15 | FORCE CHECK BITS ON MEMORY | 0 = GENERATE<br>1 = FORCE | 0 |
| 16 | TYPE OF ERROR CHECK ON MEMORY | 0 = SEC & DED<br>1 = PARITY | 0 |
| 17 | ERROR CORRECTION ON DETECTING AN ERROR | 0 = CORRECT<br>1 = DON'T | 0 |
| 19:18 | DATA BITS ON SYSTEM BUS WITH FORCED BAD PARITY (USED WHEN BIT 6 = 1) | 00 = SD07-SD00<br>01 = SD15-SD08<br>10 = SD23-SD16<br>11 = SD31-SD24 | 00 |
| 20 | TYPE OF PARITY FOR PARITY ERROR CHECKED MEMORY (USED WHEN BIT 16 = 1) | 0 = EVEN<br>1 = ODD | 0 |
| 21 | TEST DATA PAIR SELECTION FOR MARCH TEST | 0 = ALL 0'S/ALL 1'S<br>1 = ALL 5'S/ALL A'S | 0 |
| 31:22 | RESERVED | | ALL X'S |

*FIG. 12*

| | STATUS REGISTER | | |
|---|---|---|---|
| BIT NO. | DEFINITION | | VALUE AFTER RESET |
| 0 | WRITE DATA PARITY ERROR FLAG | 1 = ERROR<br>0 = NO ERROR | 0 |
| 1 | SINGLE BIT MEMORY ERROR FLAG | 1 = ERROR<br>0 = NO ERROR | 0 |
| 2 | MULTIPLE BIT MEMORY ERROR FLAG | 1 = ERROR<br>0 = NO ERROR | 0 |
| 3 | MARCH TEST ERROR FLAG | 1 = ERROR<br>0 = NO ERROR | 0 |
| 7:4 | RESERVED | | ALL X'S |
| 14:8 | SYNDROME OR MARCH TEST DATA ERROR BITS | | ALL 0'S |
| 23:15 | RESERVED | | ALL X'S |
| 30:24 | CHECK BITS FOR THE MOST RECENT DATA READ FROM MEMORY | | ALL X'S |
| 31 | RESERVED | | X |

*FIG. 13*

METHOD AND APPARATUS FOR PROGRAMMABLE MEMORY CONTROL WITH ERROR REGULATION AND TEST FUNCTIONS

TECHNICAL FIELD

This invention relates to an electronic circuit, and method of its use, for controlling an array of memory devices, as well as for testing the devices and selectively correcting any errors found therein.

BACKGROUND OF THE INVENTION

Continued advances in the design of Random Access Memory devices (RAMs) has led to tremendous increases in their storage capacity. The storage capacity of individual RAMs has risen from 4K bits to 4 megabits within a relatively short time. In only a few years, 16-megabit RAMs are expected. The low cost of present-day RAMs now makes it practical to employ large arrays of such RAMs in computers and computer-based systems. When found in such computers and computer-based systems, such RAMs are arrayed on one or more printed wiring boards, usually called "memory boards."

As the storage capacity of present-day RAMs has increased, so too has the time required to test RAMs arrayed on memory boards by conventional testing techniques which typically involve software-based testing algorithms executed by a microprocessor. The simplest method of testing an array of RAMs is to write a first binary bit (e.g., a "1") into each successive storage location and then read the location to determine if the previously-written bit appears. Thereafter, a second binary bit (i.e., a "0") is written into each successive storage location and then a read operation is performed to see if indeed that bit now appears. (Whether a "1" or "0" is written first is immaterial.) If the bit read from a RAM location is different from the bit previously written into the same location, then a fault exists.

Algorithms for testing an array of RAMs by successively writing and reading "1"s and "0"s into successive locations are generally known as "marching" algorithms. The simplest marching algorithm is carried out by writing and reading a "1" into each successive RAM location followed by writing and then reading a "0" writing and then reading a "0" (or vice versa) into each such location. As may be appreciated, such a test requires accessing each memory location in each RAM in the array four separate times. For this reason, such a marching algorithm is said to have a complexity of 4N. More sophisticated marching algorithms, which require accessing each location more times, have a correspondingly greater complexity. Marching algorithms having a complexity of 14N or even 30N are not unusual.

The greater the number of times each storage location of each RAM in an array must be accessed, the longer the time for testing since there is a finite time (e.g., 80 nanoseconds) required to access each location. Even for a very fast microprocessor running at a speed as high as 33 MHz, the time required for the microprocessor to test a memory board having a large array of RAMs by executing a simple marching algorithm can be long.

Thus, there is a need for a circuit especially adapted for testing an array of RAMs in a rapid and efficient manner.

SUMMARY OF THE INVENTION

Briefly, in accordance with the invention, a circuit is provided for controlling as well as testing an array of RAMs. The circuit of the invention includes a controller which serves to initiate an access of a storage location in one of the RAMs corresponding to a user-prescribed address. In addition, the controller is also operative to initiate a user-prescribed marching test of the memory locations during selected intervals. In addition to the controller, the invention also includes a data path section which serves to store data to be written to and read from the accessed memory location as well as to detect parity errors (if any) in the user-prescribed address and in data to be written to the RAMs and errors, if any, in the memory locations detected during execution of the user-prescribed march test. The circuit of the invention, which includes specific elements for initiating testing of an array of RAMs and for detecting errors during testing, can carry out testing of the RAMs very rapidly, even faster than a conventional microprocessor.

In a preferred embodiment of the invention, an interface is provided to allow the circuit to communicate test information and commands across a four-wire boundary scan port to facilitate boundary scan testing of the circuit initiated by an external test system.

BRIEF DESCRIPTION OF THE DRAWING

FIG. 2 is a map of a set of registers within a first register array in the circuit of FIG. 1

FIG. 3 is a map of the bit fields within a command register in the array of FIG. 2;

FIG. 4 is a map of the bit fields within a status register in the array of FIG. 2;

FIG. 5 is a map of the bit fields within a march element, a number of which are stored in the registers in FIG. 2;

FIG. 6 is a map of the bit fields within an error flag register in the array of FIG. 2;

FIG. 7 is a table of the operation codes produced by an opcode generator within the circuit of FIG. 1;

FIG. 9 is a table showing the state traversals of the state machine of FIG. 8 for each of a plurality of different operations executed by the circuit of FIG. 1;

FIG. 11 is a map of a set of registers within a second register array in the circuit of FIG. 1;

FIG. 12 is a map of the bit fields within a first command register in the array of FIG. 11;

FIG. 13 is a map of the bit fields within a first status register in the array of FIG. 11;

DETAILED DESCRIPTION

Figure 1:
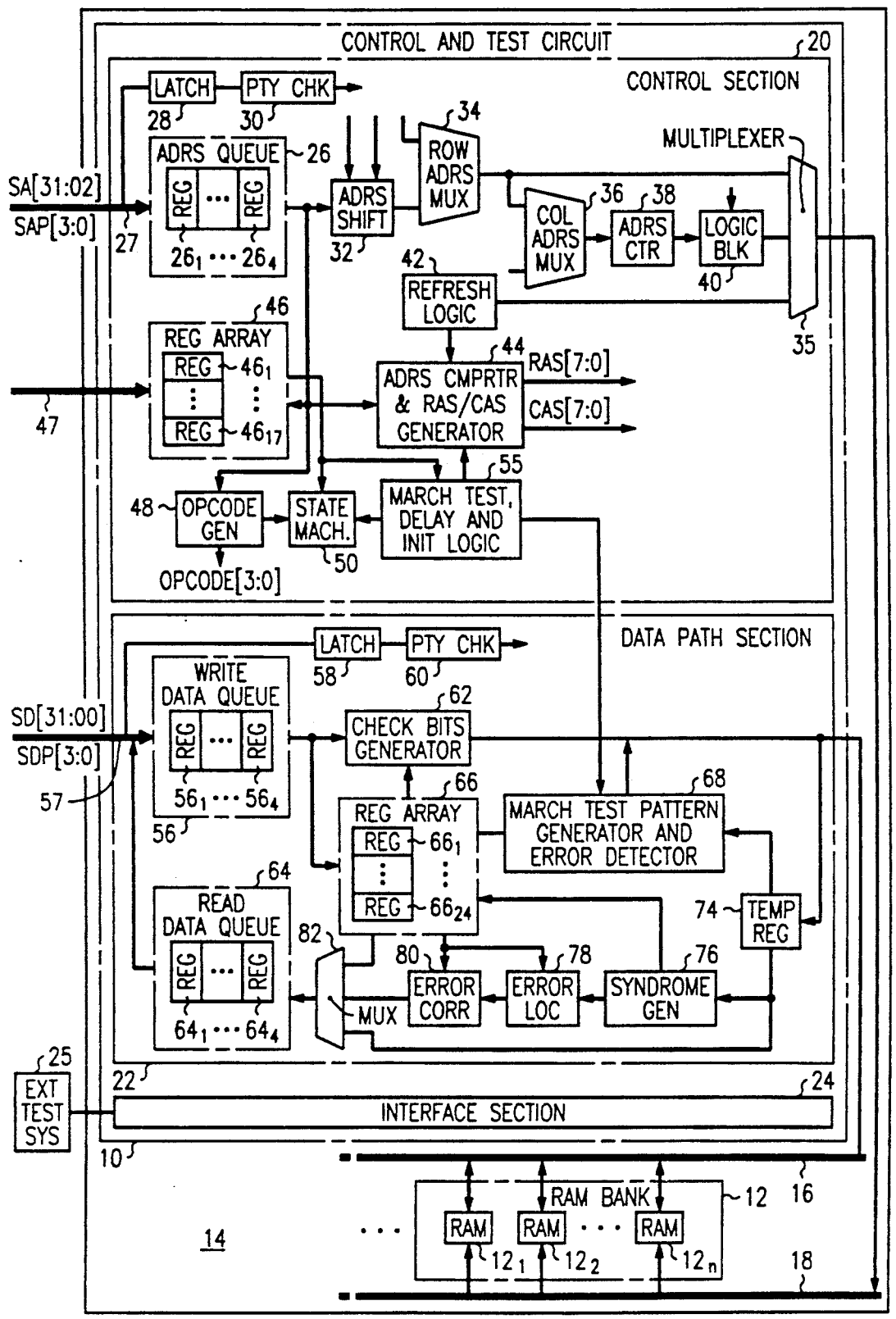
FIG. 1 is a block schematic diagram of a circuit, in accordance with the invention, for controlling a bank of RAMs and for testing the RAMs in each bank to detect faults, if any, therein.

FIG. 1 is a block diagram of a control and test circuit 10 in accordance with the invention for controlling and testing up to eight separate banks 12 of conventional RAMs $14_1$, $14_2$, $14_3 \ldots 14_n$ (only one bank of RAMs being illustrated). The RAM banks 12, together with the test and control circuit 10, are carried by a circuit board 15. The number n of RAMs $14_1$, $14_2$, $14_3 \ldots 14_n$ in each bank 12 depends both on the desired width of the data words to be stored as well as the number of check or parity bits associated with each stored word.

In a preferred embodiment, the length of each data word stored by each RAM bank 12 is thirty-two bits, while seven additional check bits are stored with each data word for parity checking purposes. Thus, the total width of each data word and associated check bit sum is thirty-nine bits. In a preferred embodiment, each RAM $14_1$, $14_2$, $14_3 \ldots 14_n$ in each bank 12 is chosen to be of the $4M \times 1$ variety and thus, each bank includes thirty-nine separate RAMs $14_1$–$14_{39}$. Data is entered to, and retrieved from, the RAMs $14_1$–$14_{39}$ in the banks 12 through a data bus 16 while address information is supplied to each bank on an address bus 18. It should be understood that each bank 12 could be comprised of a lesser or greater number of RAMs $14_1$–$14_n$ and the configuration of the RAMs in the banks may be different, depending on the desired width of the data word to be stored and the number of associated check bits. For example, the width of each data word to be stored could be as wide as 256 bits, necessitating that each bank 12 be comprised of the corresponding number of RAMs required to store a word of such a width and the parity bits associated therewith.

The control and test circuit 10 of the invention is comprised of a control section 20, a data path (i.e., error detection and correction section) 22, and an interface section 24. As will be described in greater detail below, the control section 20 serves to control the addressing as well as the testing of the RAMs $14_1$, $14_2$, $14_3 \ldots 14_n$ in each bank 12. The data path section 22 serves to detect the presence of any errors during execution of a user-prescribed march test algorithm initiated by the control section 20. Also, the data path section 22 serves to detect check bit errors and to correct any single-bit memory errors.

Figure 16:
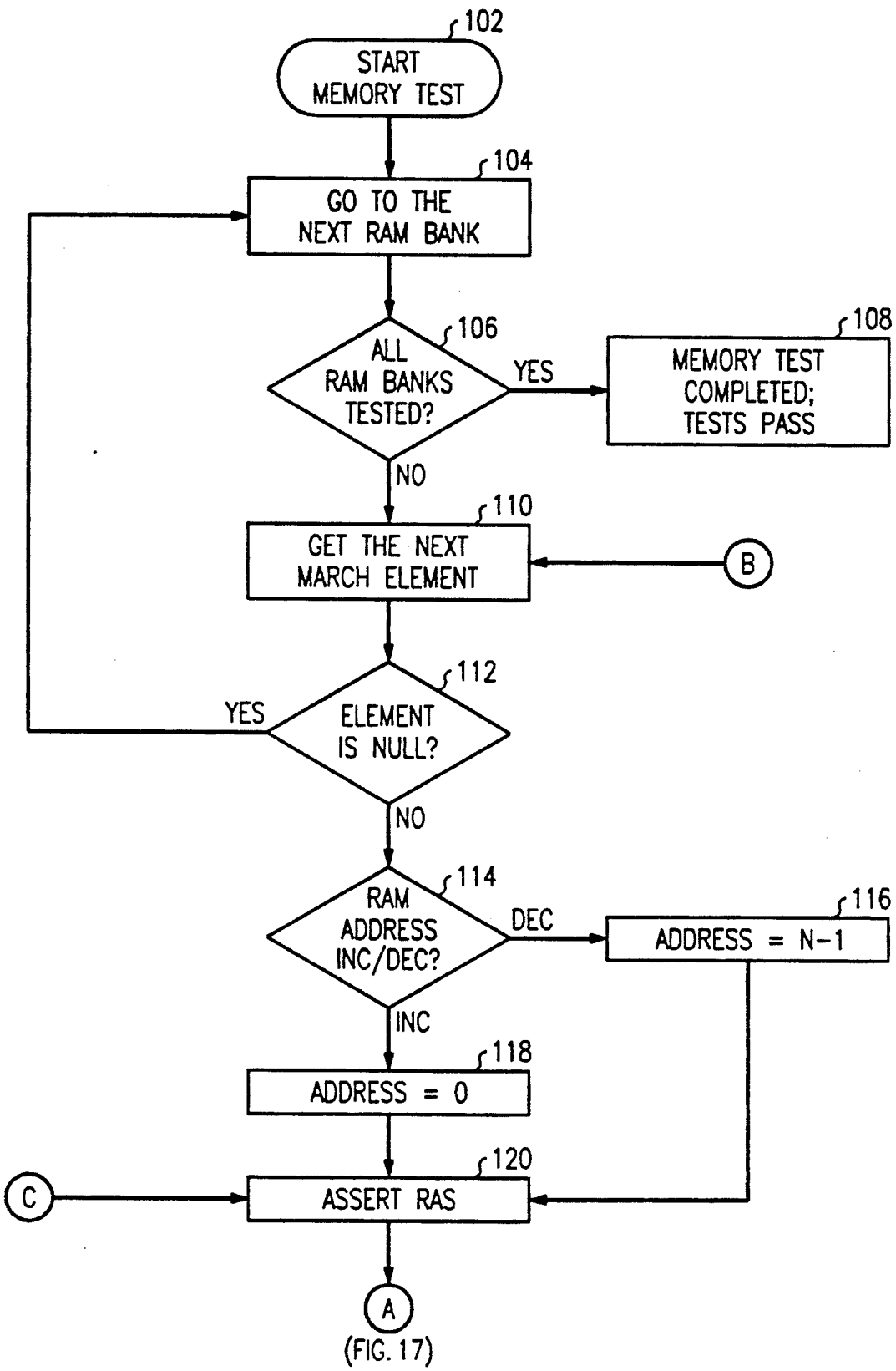
FIGS. 16 and 17 collectively illustrate a flowchart diagram of a marching algorithm used to test the RAMs of FIG. 1.

The interface section 24, described in greater detail with respect to FIG. 16, provides the control and test circuit 10 with an ability to communicate with an external test system 25 through a four-wire boundary scan port meeting the IEEE 1149.1 Standard, as described in the document IEEE 1149.1 Boundary Scan Access Port and Boundary-Scan Architecture, available from the IEEE, New York, N.Y.

Control Section 20

As seen in FIG. 1, the control section 20 includes an address queue 26 which takes the form of a first-in, first-out (FIFO) register array comprised of four separate registers $26_1$, $26_2$, $26_3$ and $26_4$, each thirty bits wide. Each of the four registers $26_1$, $26_2$, $26_3$ and $26_4$ is supplied, via a bus 27, with a separate one of four, thirty-bit address words (SA[31:02]) from an external source (not shown), such as a microprocessor or the like, coupled to the RAM banks 12. Each address word SA[31:02] is indicative of the address of a storage location in one of the RAM banks 12 or a storage location in the control section 20 itself. By configuring the address queue 26 of four separate registers $26_1$, $26_2$, $26_3$ and $26_4$, an address word stored in one of the four registers can be read while a new address word can be entered to another register in the queue to provide for more rapid access.

Each address word SA[31:02] is supplied with a four-bit parity word SAP0–SAP3. The parity word SAP0–SAP3 supplied with each address word SA[31:02] is not stored in the address queue 26, but rather, is stored in a latch 28. After being received at the latch 28, the parity word SAP0–SAP3 is passed to a parity-checking circuit 30, configured of an exclusive OR gate tree (not shown). The parity-checking circuit 30, when rendered operative in a manner described hereinafter, evaluates the parity word SAP0–SAP3 to determine if the address word SA[31:02] has the proper parity.

The action taken by the parity-checking circuit 30 if the parity word is found to be in error depends on whether the address word SA[31:02] refers to a storage location in one of the RAM banks 12 or to a storage location in the circuit 10 itself. If the address word SA[31:02] refers to a storage location in a RAM bank 12, and the associated parity word SAP0–SAP3 indicates an incorrect parity, then the address queue 26 is inhibited from placing such an address word on the bus 18. On the other hand, if the address word SA[31:02] corresponds to a storage location in the circuit 10, and the associated parity word SAP0–SAP3 indicates an incorrect parity, the address queue 26 nonetheless will output the address word. In this way, communication with the circuit 10 is permitted, even though the proper storage location therein may be addressed.

The address word SA[31:02] output by the address queue 26 is input to an address shifter 32, comprised of a combinatorial circuit, for selectively shifting and deleting bits of the address word in accordance with the memory width and page size. The page size, which is user-selected, determines the number of consecutive storage locations which may be accessed during page burst mode operation of the RAMs $14_1$, $14_2$, $14_3 \ldots 14_n$. In the preferred embodiment of the circuit 10, the page size is typically two for a thirty-two bit wide data word. (Note that the page size may be as large as sixteen.) The memory size influences the number of bits in the address word SA[31:02] identifying the row and column of the desired location to be accessed. For example, in a preferred embodiment where each of the RAMs $14_1$, $14_2$, $14_3 \ldots 14_n$ is of the $4M+1$ variety, the row- and column-identifying portions of the address word SA[31:02] are each eleven bits long.

The address-shifting circuit 32 is coupled to a row address multiplexer 34 which serves to multiplex the address word processed by the address shifter, with a signal indicative of the memory width, to produce a signal indicative of the row address of the desired storage location in a particular RAM bank 12. The output of the row address multiplexer is coupled to the input of a multiplexer 35 which feeds the address bus 16.

The address-shifting circuit 32 is also coupled to a column address multiplexer 36. The multiplexer 36 serves to multiplex the address word processed by the address shifter 32 with a signals indicative of the density and width of the RAMs $14_1$–$14_n$ in each bank 12 to yield an address count for an address counter 38 whose output signal specifies the column address of the storage location in the particular RAM bank 12. The output of the counter 38 is input to a logic block 40 which serves to either increment or complement the address count during page mode addressing. The output of the logic block 38 is input to the multiplexer 35, which, as described, feeds the address bus 16. A refresh logic block 42, in the form of a counter, also feeds the multiplexer 35 to provide a refresh address on the address bus 16.

To support the addressing of multiple RAM banks 12, the control section 20 includes an address comparator and row address strobe/column address strobe generator unit 44. Within the unit 44 is a comparator (not shown) which serves to compare the address word received from the address queue 26 to a prescribed list of address words to determine within which of the banks 12 the storage location corresponding to address word SD[31:02] lies. Based on the results of such comparison, each of a pair of logic circuits (not shown) within the unit 44 generates a separate one of a pair of eight-bit signals RAS 0-7 and CAS 0-7, respectively, to enable the row and column, respectively, of the particular bank 12 containing the desired location to be accessed. The refresh logic circuit 42, which serves to refresh the address line 16, also serves to refresh the unit 44.

Within the control section 20 there is a register array 46 which contains seventeen individual registers $46_1$–$46_{17}$ for storing command information and data received on an input bus 47. FIG. 2 is a map of the register array 46, identifying the addresses (in hexadecimal) of the individual registers $46_1$–$46_{17}$ (with x indicating don't care values) and the register access mode (i.e., whether the register is both a read/write or a read-only)

The register $46_1$ within the register array 46 is typically thirty-two bits wide and is hereinafter referred to as the command register because it stores a thirty-two-bit command word which controls the operation of the circuit 10. FIG. 3 is a map of the bit fields in the command register $46_1$. The status of bit 0 determines whether the control section 20 initiates a march test on one or more of the eight RAM banks 12 controlled by the circuit 10. Bits 1-8 each enable a separate one of the eight RAM banks 12 for testing. Bit 9 determines whether the testing of the designated RAM bank 12 is to run to completion or is to be interrupted when a fault is found. Bit 10 determines whether the logic block 38 increments or complements the column address output by the column address multiplexer 36. Bits 12 and 13 reflect the number of consecutive accesses to be completed during page mode accessing of each RAM bank 12. Bits 14 and 15 reflect the address queue depth, that is, the total number of the registers $26_1$, $26_2$, $26_3$ and $26_4$ that are utilized to store incoming addresses. Bits 16 and 17 determine the refresh interval.

The status of bit 18 determines whether the control section will carry out a memory "scrubbing" operation, i.e., correction of a single faulty bit found during a normal read operation. Bits 19-26 reflect which of the banks 12 is currently active. Bit 28 provides the option to disable the refresh logic circuit to facilitate external refresh commands. Bit 29 allows the parity of the address input to the address queue 26 to be set even or odd, while bit 30 controls whether the address word SA[31:2] input to the address queue is to be checked for parity by the parity-checking circuit 30. Bits 11, 27 and 31 are reserved for future use.

Referring to FIG. 2, the register $46_2$ within the register array 46 is typically thirty-two bits wide and is hereinafter referred to as the status register because it stores a thirty-two-bit status word containing information about the presence and population of the RAM banks 12. FIG. 4 is a map of the bit fields in the status register $46_2$. Bits 0-3 of the status register $46_2$ establish a four-bit identification code for the control section 20 of the control and test circuit 10. By control sections of separate circuits 10 to control different RAM banks 12 on the same circuit board 15. Bits 4-11 reflect how many banks 12 of RAMs $14_1$, $14_2$, $14_3$ ... $14_n$ are present (i.e., how many are to be controlled and tested by the circuit 10). The bit pairs 13:12, 15:14, 17:16, 19:18, 21:20, 23:22, 25:24 and 27:26 reflect the configuration of a separate one of the eight RAM banks 12 controlled by the control section 20. While each of the RAMs $14_1$, $14_2$, $14_3$ ... $14_n$ has been described as being of the 4M×1 variety, the controller 20 is fully capable of controlling RAMs of the 256K×1, 256K×4, 1M×1, 1M×4, 4M×1, 4M×4, 16M×1 or 16M×4 variety. Bit 28 is indicative of a particular version of the circuit 10. Bits 29-31 provide an indication of which of eight separate memory banks 12 to be tested contains a fault.

Referring to FIG. 2, the register $46_3$ in the register array 46 is typically thirty-two bits wide and is referred to as the error address register because it stores the address of the first location in the memory banks 12 found to contain an error. The error may be non-fatal as in the case of a single bit error or a memory march test error. In contrast, the error may be fatal, as in the case of a multiple bit error, a write data parity error, an address parity error or a memory bank error.

The register $46_4$ in the register array 46 is also typically thirty-two bits wide and is designated as the strobe shape register, because it stores a pattern of bits that establishes the parameters of the Row Address Strobe (RAS) and the Column Address Strobe (CAS) signals generated by the address comparator and RAS and CAS generator 44 of FIG. 1.

Within the register array 46 are the four registers $46_5$–$46_8$, each typically thirty-two bits wide. Each of the registers $46_5$–$46_8$ is referred to as a march test register because the register stores a collection of march test "elements" to be executed during testing of a RAM bank 12. Each march test element is comprised of one or more sequences of read and write operations. In the illustrated embodiment, each march element may be comprised of as many as seven separate read and write operations.

FIG. 5 is a map of the bit fields within a march test element. Bits 2:0 in the element specify the number of read/write operations (up to seven) specified thereby. Bit 3 specifies whether the operations comprising the march element should be performed on successive memory locations in ascending or descending address order. Bits 5:4 specify the nature of the first operation of the march test (i.e., a whether the operation is to be a read or write operation). The bit pairs 7:6, 9:8, 11:10, 13:12, 15:14 and 17:16, specify the nature of the remaining six operations, respectively, of the march elements.

Referring to FIG. 2, the registers $46_9$–$46_{16}$ are typically thirty-two bits wide, with each being designated as a "bank address boundary register" for a corresponding one of the eight RAM banks 12. Each bank 12 has a starting address (a "lower" address) and an ending address (an "upper" address) for all of the memory locations in that bank. The upper and lower addresses are referred to as the "bank boundary" addresses. The bank boundary address for each of the eight RAM banks 12 is stored in a separate one of the address boundary registers $46_9$–$46_{16}$, respectively. In this way, an incoming address can be checked against the values in a separate one of the eight bank address boundary registers $46_9$–$46_{16}$ to determine which bank is being accessed.

Referring to FIG. 2, the register array 46 also contains the register $46_{17}$ which is typically thirty-two bits wide. The register $46_{17}$ is referred to as an error flag register, as the state of the various bits in the register reflects whether or different errors have occurred during testing. FIG. 6 is a map of the bit fields in the register $46_{17}$. Each of the bits 7:0 represents the presence or absence of a particular one of eight different types of errors. Bits 31:8 are reserved for future use.

Referring to FIG. 1, within the control section 20 is an opcode generator 48, typically an encoder, which generates a four-bit operation code ("opcode"), designated by the term OPCODE[3:0], in accordance with command signals externally input to the control section along the bus 27. The four-bit opcode generated by the opcode generator 48 designates a particular one of sixteen different operations to be carried out on the RAM banks 12. FIG. 7 shows a table of the opcodes generated by the opcode generator 48 and the operations which correspond to each opcode.

Figure 8:
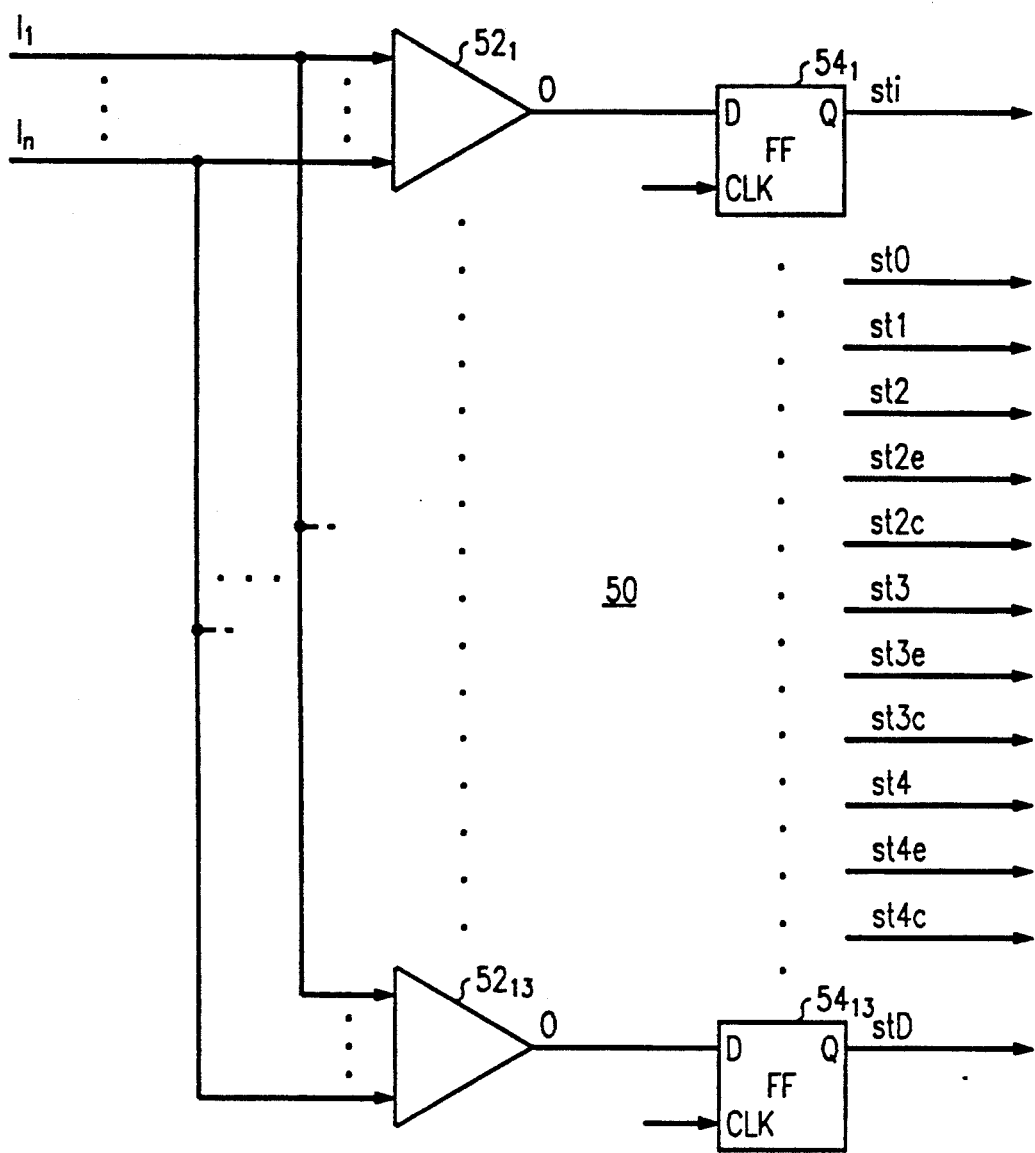
FIG. 8 is a block schematic diagram of a state machine within the circuit of FIG. 1.

Referring to FIG. 1, the four-bit opcode generated by the opcode generator 48 of FIG. 1 is input both to the data path section 22, as well as to a state machine 50 illustrated in FIG. 8. Referring to FIG. 8, the state machine 50 is typically a thirteen-state machine comprised of thirteen combinational circuits $52_1$, $52_2$, $52_3$... $52_{13}$ and thirteen separate flip-flops $54_1$, $54_2$, $54_3$... $54_{13}$, each associated with a corresponding combinational circuit. The combinational circuits $52_1$–$52_{13}$ each have a set of inputs $I_1$, $I_2$... $I_n$ supplied with a separate one of the bits of the opcode from the opcode generator 48 as well as selected bits from the command register $46_1$. Each of the combinational circuits has a single output O coupled the D input of a corresponding one of the flip-flops $54_1$, $54_2$, $54_3$... $54_{13}$, respectively. Within each of the combinational circuits $52_1$, $52_2$, $52_3$... $52_{13}$ is a set of logic gates (not shown) of the NAND, AND, NOR and OR variety connected so each circuit only outputs a "1" at its output O when a particular bit pattern is present at the input of the circuit.

When supplied with a "1" at its D input, each of the flip-flops $54_1$, $54_2$, $54_3$... $54_{13}$ produces a separate one of a set of logic "1" level state bits sti, st0, st1, st2, st2e, st2c, st3, st3e, st3c, st4, st4e, st4c and stD, respectively. The combinational circuits $52_1$, $52_2$, $52_3$... $52_{13}$ are configured so that at any given time, only one of the state bits sti, st1, st0, st1, st2, st2e, st2c, st3, st3e, st3c, st4, st4e, st4c and stD will be set (i.e., at a "1" level). FIG. 6 shows the sequence of the state bits produced by the flip-flops $54_1$–$54_{13}$ during each of the various operations of the circuit 10 of FIG. 1. The state bits from the state machine 50 of FIG. 1 are distributed to various elements of the circuit 10 to effectuate a separate one of the operations described in FIG. 6.

Figure 10:
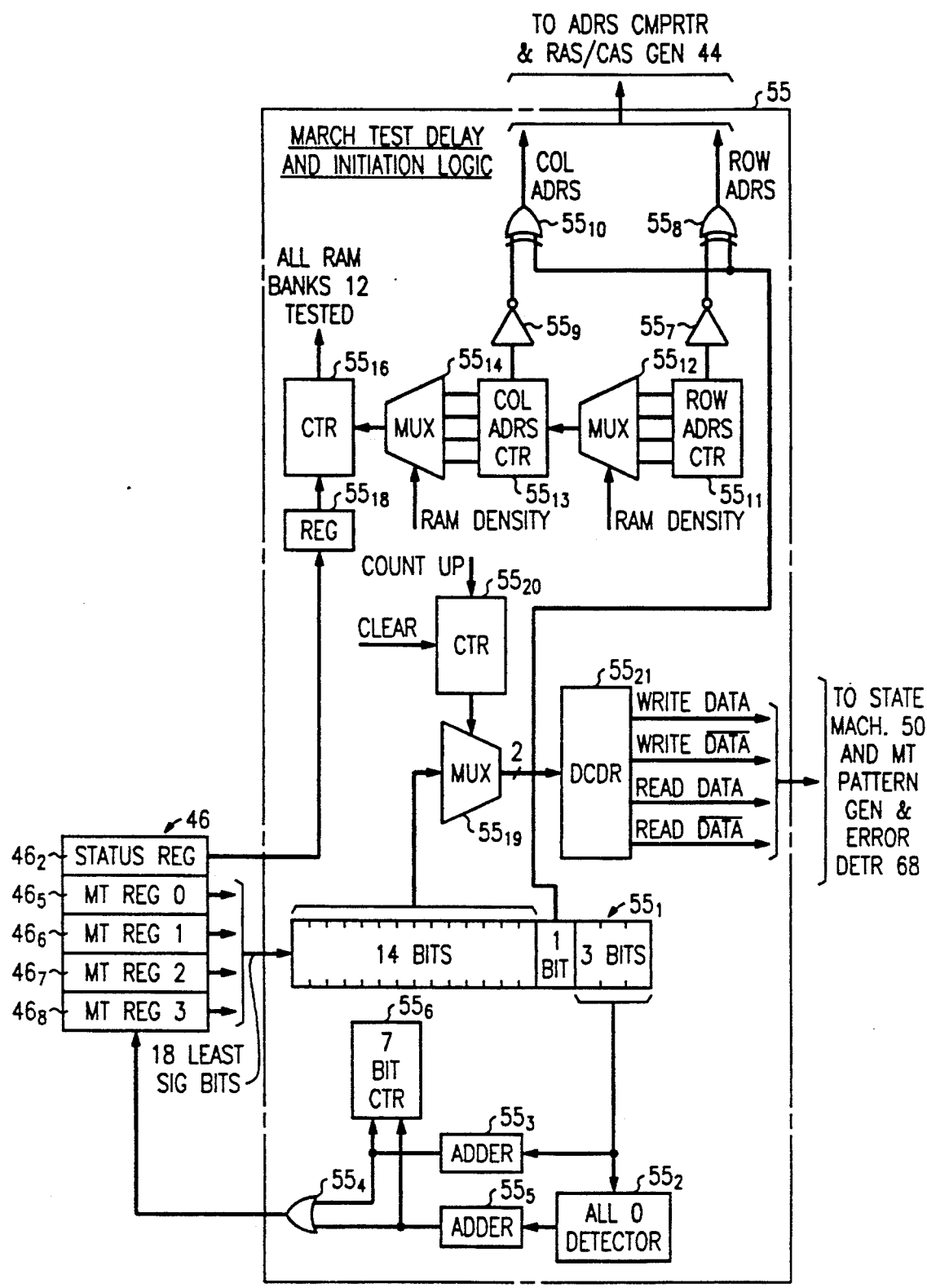
FIG. 10 is a block schematic diagram of a march test delay and initialization logic unit within the circuit of FIG. 1.

Referring to FIG. 1, coupled to the state machine 50 and to the address comparator and row address strobe and column address strobe unit 44 is a march test delay and initialization logic unit 55 which serves to initiate execution of a march test on selected RAM banks 12. FIG. 10 is a schematic block diagram of the logic unit 55. As seen in FIG. 10, the logic unit 55 includes an eighteen-bit temporary register $55_1$ for storing the eighteen least significant bits in a successive one of the March Test (MT) registers $46_5$–$46_8$, representing the march test elements in that register. In practice, the march test registers $46_5$–$46_8$, each thrity-two bits wide, are collectively treated as a single, 128-bit shift register to facilitate shifting out of the march elements stored in these registers in sequential fashion, starting with the register $46_5$ first.

To facilitate such shifting, the least significant three bits stored in the register $55_1$ (representing the number of operations in the march test element just read from a successive one of the registers $46_5$–$46_8$) are input to both an all-zeros detector (i.e., a three-input NOR gate) $55_2$ and to a first adder circuit $55_3$. For the condition where the least significant three bits in the register $55_1$ are all non-zero (indicating that the current march test element contains one or more operations), the first adder circuit $55_3$ determines the number of bits to be shifted from the march test registers $46_5$–$46_8$ in order to fetch the next march test element. The output of the first adder $55_3$ is supplied to a first input of a two-input OR gate $55_4$ whose output signal controls the shifting of bits out of the march test registers $46_5$–$46_8$ and into the register $55_1$.

The all-zeros detector $55_2$ has its output coupled to a second adder circuit $55_5$ whose output is coupled to the second input of the OR gate $55_4$. The second adder $55_5$ determines the number of bits to be shifted from the registers $46_5$–$46_8$ to return to the first march test element in the first march test register $46_5$ when an all-zero condition is detected. As should be appreciated, an all-zero condition arises when the number of operations in the current march test element is zero. If the current march test element has no operations, then the remaining march test elements which follow will also have zero operations. Thus, upon encountering an all-zero condition, it is desirable to shift through the remaining locations in the march test registers $46_5$–$46_8$ to return to the first march test element in the first march test register.

The outputs of the adders $55_3$ and $55_5$ are coupled to a seven-bit counter $55_6$ which serves to count the total number of bits shifted out the march test registers $46_5$–$46_8$. In this way, a determination can be made when 128 bits (the total contents of the march test registers $46_5$–$46_8$) have been shifted out.

The fourth least significant bit stored in the register $55_1$, which represents the address progression bit of the currently active march test element, is input to a first input of a separate one of a first set of twelve exclusive OR gates, represented collectively by the gate $55_8$. The fourth least significant bit in the register $55_1$ is also input to a first input of a separate one of a second set of twelve exclusive OR gates, collectively represented by a gate $55_{10}$. Each of the first set of twelve exclusive OR gates, represented by the gate $55_8$, has their second input supplied with a separate one of the bits generated by a twelve-bit counter $55_{11}$, the count of the counter corresponding to the row address of the particular RAM bank 12 whose storage location is to be accessed for testing purposes. The output of the first set of twelve exclusive OR gates, represented by the gate $55_8$, is supplied to the address comparator and row address strobe and column address strobe generator 44 of FIG. 1.

The four most significant bits of the counter $55_{11}$ are input to a multiplexer $55_{12}$ which is controlled by a signal indicative of the density in the RAMs $14_1$–$14_n$ in the banks 12. The output signal of the multiplexer $55_{12}$, representing the row address of the particular RAM bank 12 location to be accessed, is input to a second twelve-bit counter $55_{13}$ which serves to generate a column address of the particular RAM bank 12 to be accessed. The least significant twelve bits of the counter $55_{13}$ is supplied to the second input of the second set of twelve exclusive OR gates, represented by the gate $55_{10}$. The output signal of the gate $55_{10}$ is supplied to the strobe generator unit 44.

The four most significant bits of the counter $55_{13}$ are input to a multiplexer $55_{14}$, which like the multiplexer $55_{12}$, is controlled by a signal indicative of the density of the RAMs $14_1$-$14_n$ in the RAM banks 12. The output signal of the multiplexer $55_{14}$, indicative of the column of the RAM bank 12 being accessed, is input to a counter $55_{16}$ which is typically initially loaded with data from a register $55_{18}$ which is supplied from the status register $46_2$ with the number of RAM banks 12 which are present. In response to the signal from the multiplexer $55_{14}$, the counter $55_{16}$ is decremented. Thus the counter $55_{16}$ will output a signal of a predetermined state when all the RAM banks 12 have been tested, The most significant fourteen bits of the data stored in the register $55_1$, which represent the seven separate operations of the currently-active march element, are input to a multiplexer $55_{19}$, comprised of two individual 7:1 multiplexers. The multiplexer $55_{19}$ is controlled by a three-bit counter $55_{20}$, which determines which pair of the bits input to the multiplexer are output to a decoder $55_{21}$ which decodes the bits to yield a separate one of four signals WRITE DATA, $\overline{\text{WRITE DATA}}$, READ DATA and $\overline{\text{READ DATA}}$. The signals from the decoder $55_{21}$ are supplied to the state machine 50 of FIG. 1 and to the march test pattern generator and error detector unit 68 of FIG. 1.

Data Path Section 22

The data path section 22 includes a write data queue 56, typically a FIFO device comprised of four registers $56_1$, $56_2$, $56_3$ and $56_4$ supplied with a separate one of four, thirty-two-bit data words SD[31:00] input on a bus 57. Since each data word is thirty-two bits wide, each of the registers $56_1$, $56_2$, $56_3$ and $56_4$ in the data queue 56 is likewise thirty-two bits wide. In the event that the data words were of a greater width (say, 256 bits wide), then each of the registers $56_1$, $56_2$, $56_3$ and $56_4$ would be correspondingly wider.

Supplied along with each data word SD[31:00] is a four-bit parity word SDP[3:0] indicative of the parity of the data word. Upon receipt, each parity word SDP[3:0] is separately stored in a latch 58 before being supplied to a parity-checking circuit 60 of the same general construction as the parity-checking circuit 30. The parity-checking circuit 60, when rendered operative in the manner described, checks the parity word SDP[3:0] to determine if the corresponding incoming data word SD[31:00] has the proper parity. As in the case of the address queue 26, the action taken following a determination of incorrect parity of an incoming data word SD[31:00] depends on whether the data is to be written into one of the RAM banks 12, or into the circuit 10. A data word SD[31:00] having an incorrect parity will not be written into a RAM bank 12 from the write data queue 56 but will be written from the queue into a storage location in the circuit 10.

The data word SD[31:00] first written into the write data queue 56 is output to a check bit generator 62, typically an exclusive OR tree (not shown), which, when rendered operative in the manner described, serves to generate a seven-bit parity or check sum pattern for each data word. The data word SD[31:00], together with the seven-bit parity pattern, is output on the data bus 16 for transmission to the RAM banks 12.

In addition to the write data queue 56, the data path section 22 also includes a read data queue 64, typically comprised of four separate registers $64_1$, $64_2$, $64_3$ and $64_4$, each serving to store a data word read from one of the RAM banks 12. Each of the registers $64_1$, $64_2$, $64_3$ and $64_4$ is as wide as the data words stored in the RAM banks 12.

The data path section 22 also includes a register array 66 which receives commands entered on the bus 57, as buffered by the write data queue 56. Referring to FIG. 11, which is a map of the register array 64, there is a command register $66_1$, a status register $66_2$, and an error register $66_3$. As their respective name implies, each of the command status and error registers $66_1$, $66_2$, and $66_3$, respectively, serves to store commands, status information, and error data, respectively. As indicated previously, in the preferred embodiment, the length of the data word stored by each RAM bank 12 is thirty-two bits wide. In the event that the data word is of greater length, implying a larger array of RAM banks 12, it may be necessary to replicate the features of the data path section 22, including the addition of separate command states and error registers (not shown) for controlling and testing the additional RAM banks.

FIG. 12 is a map of the bit fields within the command register $66_1$ of FIG. 11. Within the command register $66_1$, the bit pair 1:0 specifies the depth (number of active registers) within the write data queue 56 while the bit pair 3:2 specifies the depth of the read data queue 64. Bit 4 specifies whether the data word written into the RAM bank 12 associated with the command register has even or odd parity. Bit 5 specifies whether a parity check is to be performed by the parity-checking circuit 60. Bit 6, when set, forces the parity bit pattern of the data word read from the associated RAM bank 12 SDP[3:0] to purposely be incorrect to allow other circuitry to check the parity of this data word. Bit 7 controls whether, in fact, the checking of errors in the associated RAM bank 12 is to be carried out.

Bits 14:8 serve to store a preselected seven-bit check pattern to be substituted for the check bit pattern generated by the check bit pattern generator 62. Bit 15 controls whether the check bit pattern represented by bits 14:8 is to be substituted for the pattern generated by the pattern generator 62. Bit 16 determines the type of memory checking to be performed, either single or double error detection, or parity checking. Bit 17 determines whether a single incorrect memory error is to be corrected or not. Bits 19:18 specify which of the bits of the data word SD[31:0] are forced to an incorrect value parity when bit 6 is set. Bit 20 determines odd/even parity for parity checked memory. Bit 21 determines which of two different test patterns are to be employed when conducting a march test on the RAM banks 12. When bit 21 is set, then a pair of patterns 0101 . . . 01/1010 . . . 10 is employed. Otherwise the pattern 0000 . . . 0/1111 . . . 1 is employed. Bits 31:22 are reserved.

FIG. 13 is a map of the bit fields within the status register $66_2$ of FIG. 11. Bits 0, 1, 2 and 3 in the status register $66_2$ reflect the presence of a write parity error, a single-bit memory error, a multiple-bit memory error and a march test error, respectively. Bits 14:8 contain the syndrome bits of the data word last read from the RAM banks 12. Bits 30:24 contain the check bits of the most recent data read from the RAM banks 12. Bits 7:4, 15:23 and 31 are reserved.

The error data register $66_3$ within the register array 66 comprises a thirty-two-bit-wide register for storing march test error location bits or write parity error bits associated with a particular one of the RAM banks 12. Typically, the bits within these registers contain don't care values when the circuit 10 is initially powered up.

Figure 14:
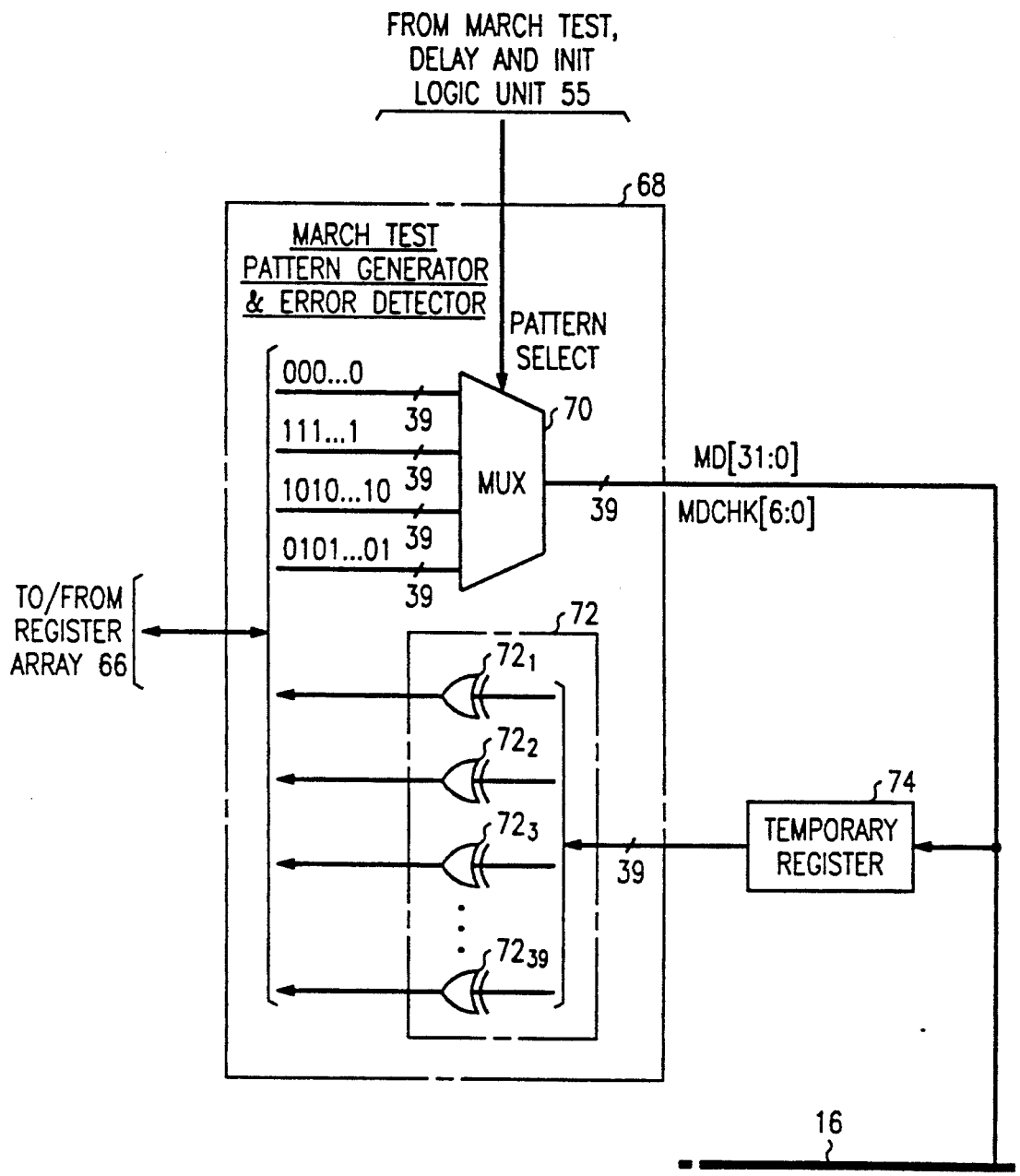
FIG. 14 is a block schematic diagram of an march test pattern generator and error detector unit within the circuit of FIG. 1.
Figure 15:
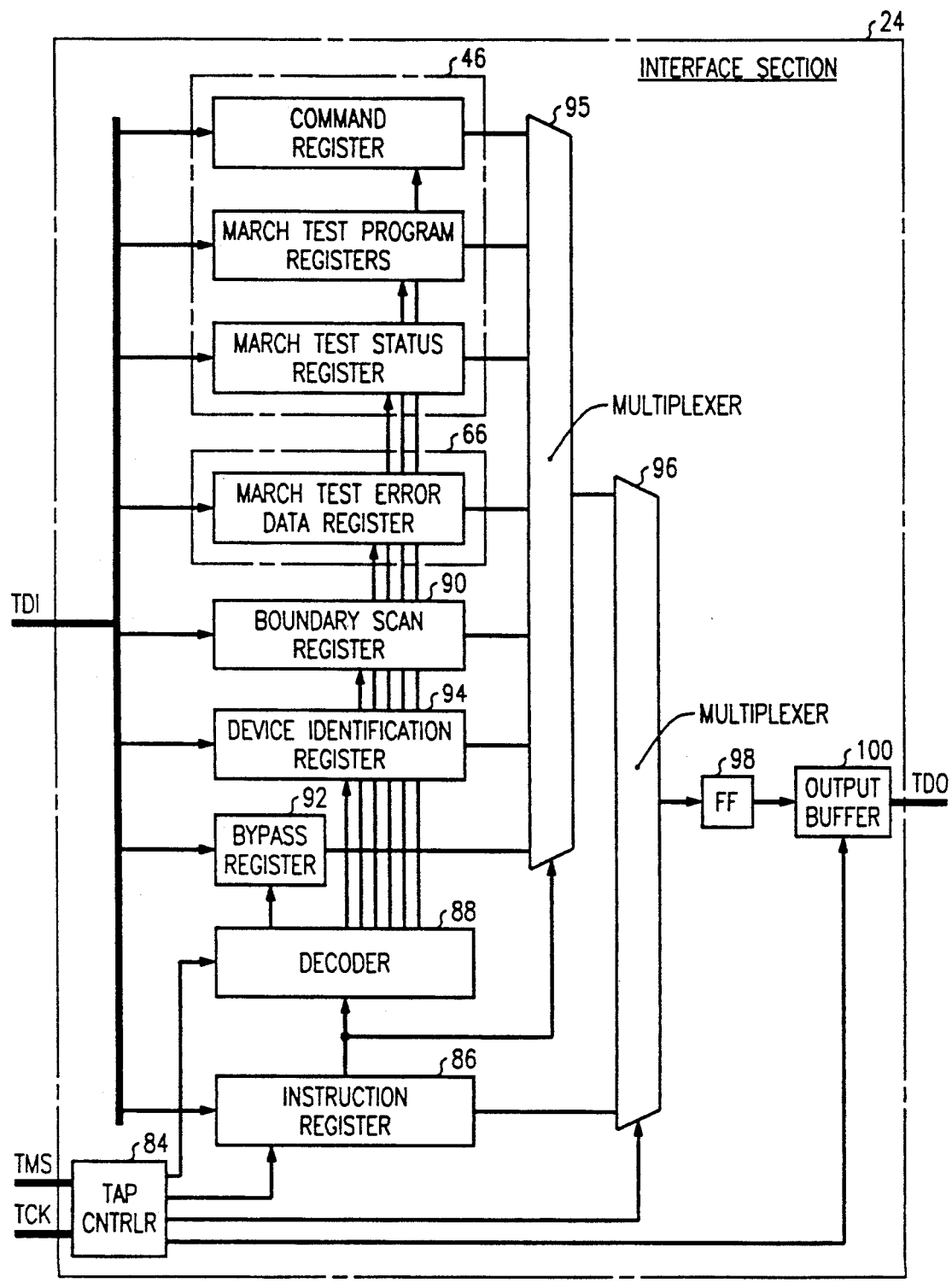
FIG. 15 is a block schematic diagram of an interface section within the circuit of FIG. 1.

Within the data path section 22 is a march test pattern generator and error detector unit 68 which serves to both generate a march test error pattern and to detect any errors following pattern transmission to the RAM banks 12. Referring to FIG. 14, the unit 68 comprises a multiplexer 70 which receives four, thirty-nine-bit test vectors {000...0} {111...1} {1010...10} and {0101...01}, respectively. The vector {000...0} is obtained by grounding the corresponding input of the multiplexer 70 while the vector {111...1} is obtained by supplying the corresponding multiplexer input with a constant voltage (e.g., 5 volts). The remaining two vectors {0101...01} and {1010...10} are obtained from a combination of the ground and five volt signals. Depending on the status of bit 21 of the register 66, command register $66_1$, and the particular opcode generated by the opcode generator 48 of FIG. 1, the multiplexer 70 serves to write a separate one of the vector pairs {000...0} and {111...1}, and {1010...10} and {0101...01} onto the data bus 16 during a march test of the associated RAM banks 12.

In addition to the multiplexer 70, the unit 68 also comprises a set of thirty-nine exclusive OR gates $72_1$–$72_{39}$, each having thirty-nine separate first inputs for receiving a separate one of the bits of a thirty-two-bit data word MD[31:0] and a seven-bit check sum MDCHK[6:0] read from one of the RAM banks 12 and thirty-nine separate second inputs for receiving a separate one of the signals output by the multiplexer 70. As indicated, during execution of a march test on each of the RAM banks 12, a test pattern pair from the multiplexer 70 is written into the RAMs $14_1 \ldots 14_n$ in each bank 12 via the data bus 16. Thereafter, the contents of the RAMs $14_1 \ldots 14_n$ in that bank are read and then stored in a temporary register 74 before input to exclusive OR gates $72_1$–$72_{39}$ of the unit 68. Upon receipt of the data word MD[31:0] and seven-bit check sum MDCHK[6:0] from the temporary register 74, the combination of exclusive OR gates $72_1$–$72_{39}$ yields a signal, indicative of a memory error, as well as a thirty-nine-bit signal indicative of the location (bit position) of the error. This information is supplied to the register array 66 for storage in a corresponding one of the error registers $66_3$, $66_6$, $66_9$, $66_{12}$, $66_{15}$, $66_{18}$, $66_{21}$ and $66_{24}$ associated with the RAM bank 12 being tested.

In addition to executing a march test and detecting errors occurring as a result thereof, the data path section 22 also serves to detect bit errors of data read from the each RAM bank 12 and to correct them if the error is of the single bit variety. To this end, the data section 22 includes a syndrome generator 76 which takes the form of an exclusive OR tree for detecting an error in the data word MD[31:0] and the seven-bit check sum MDCHK[6:0] stored in a temporary register 76 after having been read from a RAM bank 12. Any errors in this data word MD[31:0] and its seven-bit check sum MDCHK[6:0] will be reflected in the output signal of the syndrome generator 76 which is supplied both to the register array 66 and to an error location circuit 78, typically comprised of thirty-nine separate NAND gates (not shown). The error location circuit 78 points to the bit position of the error in the data word MD[31:0] and the seven-bit check sum MDCHK[6:0] upon receipt of the output signal of the syndrome generator 76.

Coupled to the output of the error location circuit 78 is an error correction circuit 80. In practice, the error correction circuit is comprised of thirty-two, two-input exclusive-OR gates (not shown), each supplied at its first input with a separate one of the thirty-two bits of the output signal of the error location circuit 78. The remaining input of each such gate is supplied with a separate one of the bits of the data word MD[31:0] held in the temporary register 74. The output of the error correction circuit 80, representing a corrected data word, is passed to a multiplexer 82 for multiplexing with data from both the register array 66 and the temporary register 74. The output of the multiplexer 82 feeds the read data queue 64.

Referring to FIG. 4, there is shown a block schematic diagram of the interface section 24 within the circuit 10 of FIG. 1 which provides a Test Access Port (TAP) to facilitate boundary scan testing of the circuit 10 in accordance with the IEEE 1149.1 Standard. Within the interface section 24 is a TAP controller 84 which is supplied with a Test Mode Select (TMS) input signal and a Test Clock (TCK) signal along a separate one of a TMS and TCK bus, respectively, from an external test system (not shown). The TAP controller 84 is typically a synchronous, finite-state machine (not shown) which controls the sequence of operations of the elements (described hereinafter) within the interface section 24 in response to the test mode select input and test clock signals entered to the TAP controller.

Among the elements within the interface section 24 controlled by the TAP controller 84 is an instruction register 86 which serves to hold test instructions entered via a Test Data Input (TDI) bus on which test data input information is entered to the interface section. The instructions contained in the instruction register 86 are decoded by a decoder 88, in response to a signal from the TAP controller 84, to control each of a bank of registers 90, 92, and 94, as well as several of the registers within the register arrays 46 and 66.

The register 90, identified as a "boundary scan register", is comprised of a series of individual register cells, (not shown), each associated with an input/output (i/o) of the circuit 10 of FIG. 1. The boundary scan cells are serially linked in a chain. When a signal of a known state is applied to each of the inputs of the circuit 10, the state of the outputs of the circuit will change in a predictable fashion, provided the circuit is operating correctly. Thus, when a stream of bits of a known state is shifted through the boundary scan cells of the register 90, the bits subsequently shifted from the register cells following receipt of a test signal by the circuit 10 should change in a predictable manner. By examining the bits shifted from the boundary scan register 90 after a stream of test vector bits of a known state has been applied to the circuit 10, any defects in the operation of the circuit 10 will manifest themselves.

The register 92 is referred to as a "bypass register" and is typically comprised of a single-shift register cell. When the bypass register 92 is rendered operative by the decoder 88, the register allows test data information entered on the TDI bus to bypass other registers within the circuit 10.

The register 94, which is not essential to the operation of the interface section 24, is generally referred to as a "device identification register" because it serves to store information indicative of the identity (i.e., part number) of the circuit 10, the particular version of the part, and the source of manufacture.

The interface section 24 shares the command register $46_1$, the status register $46_2$ and the march test program registers $46_5$–$46_8$ of the register array 46 with the control section 20, and also shares the error data register $66_3$ of register array 66 with the data path section 22. The registers 90, 92 and 94, and the shared command, status, march test program and error data registers each feed a multiplexer 95 controlled by the instruction register 86. The output of the multiplexer 95 feeds a first input of a multiplexer 96 whose second input is supplied with the output of the instruction register 86. In accordance with the state of a control signal supplied from the TAP controller 84, the multiplexer 96 passes the signal at a selected one of its inputs to a flip-flop 98 which, in turn, feeds an output (o/p) buffer 100, also controlled by the TAP controller. The output buffer 100 generates an output signal supplied to a Test Data Output (TDO) bus.

The interface section 24 advantageously enables the circuit 10 to be tested by the external test system 25 (not shown) using the boundary scan technique described in the aforementioned IEEE 1149.1 Standard. Moreover, by having the interface section 24 share the command register $46_1$, status register $46_2$ march test program registers $46_5$–$46_8$ of the registar array 46, and the error data register $66_3$ of the register array 66, the external test system 25 can access information concerning the testing of the RAM banks 12.

Circuit 10 Operation

The operation of the control and test circuit 10 will now be described. When the circuit 10 is first powered up, the circuit goes through an initialization phase which is entered into upon receipt of two separate reset instructions furnished to the circuit at spaced intervals. Following receipt of the second reset instruction, the opcode generator 48 generates eight separate write commands and read commands. In response to the opcodes from the opcode generator 48, the state machine 50 causes a word to be written into, and then read from, a separate one of eight selected locations in each separate RAM bank 12 to determine the population and density of the RAMs $12_1, 12_2 \ldots 12_n$ in each bank. The status register $46_2$ within register array 46 in the control section 20 is then written with the population and density of the RAMs $12_1$–$12_n$ in each RAM bank 12.

After initialization, the various registers within the register array 46 and 66 are then programmed, typically by entering appropriate data on a separate one of the buses 47 and 57, respectively. When writing data to the registers within the register array 46, the address of the register is entered to the address queue 26, and upon the acknowledgement of the address, the data is entered to the register via the bus 47. Data is written into the register array 66 in a similar fashion.

Once the circuit 10 has been initialized, and the register arrays 46 and 66 have been programmed, then the control section 20 is now capable of accessing one or more memory locations. To carry out a single read operation, the control section 20, in response to a single access read command from an external source (not shown), will strobe the address previously entered into the address queue 26 and read the corresponding location in the appropriate RAM bank 12. The data word read from the addressed location is first entered into the temporary register 74 before being checked for errors by the error correction circuit 80. Depending on the presence of either a single- or multiple-bit error, a single or multiple error flag will be set. If there is a single-bit data error, and the error correction option is enabled, then the error is corrected and the corrected data is written into the read data queue 56.

Should a multiple-bit error be present, then no data correction is possible. Instead, the data word containing two or more incorrect bits is written into the read data queue 56 while at the same time, the multiple error-bit flag will be set.

In the event that the "memory scrubbing" option is enabled, (i.e., correction or "scrubbing" of the data word) then for a data word containing a single bad bit, a corrected data word is generated by the error correction circuit 80 and the corrected word is written into the read data queue 56 as described. In addition, the check bit generator 62 will generate a check sum for the corrected data word, and this corrected data and new check sum will be written to the appropriate memory location. This write operation occurs automatically.

A single write operation is initiated by receipt by the address queue 26 of the memory location into which a data word is to be written and receipt of the word itself at the write data queue 56. If the parity-checking option is enabled, then the parity of the word in the write data queue 56 is checked. Should the word in the write data queue have an incorrect parity, the word is deleted. Otherwise, the write operaton is carried out.

In addition to permitting a single access of one of the RAM banks 12, the circuit 10 may also accomplish a multiple (page mode) access in the following manner. In response to external commands demanding a multiple read operation, such as to access a cache line in one of the RAM banks 12, the control section 20 will sequentially access the number of locations specified by bits [13:12] in the command register $46_1$ of the register array 46 of FIG. 2. In the case of a page mode read operation, multiple locations in the same row of a RAM bank 12 are accessed and each data word is read therefrom and entered to the temporary register 74. Any single-bit error in each data word read from one of the RAMs $14_1, 14_2 \ldots 14_n$ is corrected. No correction is made for a multiple-bit error, but instead, the appropriate error flags are set. A page mode write operation is carried out in much the same way as a single write operation. If during the page mode write operation, one of the words to be written has an incorrect parity, the operation is halted once the incorrect parity is detected.

The circuit 10 also permits a read-modify-write operation to be carried out upon receipt of an appropriate command. A read-modify-write operation is carried out by first performing a read operation on the location in the appropriate one of the RAM banks 12 whose address has been entered to the address queue 26. The location is then accessed and the data is read therefrom into the temporary register 74 and is thereafter checked for single- and multiple-bit errors. Single-bit errors are corrected by the error correction circuit 80 whereas multiple-bit errors are not, but instead, the appropriate error flags are set. A data word with no errors, or corrected for a single error, is then combined with the word in the write data queue 56 (assuming it has no parity errors) in accordance with a signal received by the circuit 10 specifying which bits of the word are to be modified. The modified data word and new check sum bits are then written into one of the RAM banks 12. Should the word read from memory have a multiple-bit error, or if the word in the write data queue 56 has a parity error, then no write operation is permitted.

A march test of the RAM banks 12 is initiated when bit 0 in the command register of the register 46 is set. In practice, the bit is set following initialization of the circuit 10 whereupon a march test of 6N complexity is carried out. The steps associated with carrying out a march test on a RAM bank 12 are collectively illustrated in flowchart form in FIG. 16. As best illustrated in FIG. 16, a march test on a RAM bank 12 begins upon execution of a start instruction 102 during which the error registers in the array 66 are cleared. Following the start instruction 102, a RAM bank 12, not yet tested, is designated for testing (step 104). During initial execution of step 104, the first RAM bank 12 (bank 0) is designated. Following step 106, a determination is made whether all eight of the RAM banks 12 potentially controlled by the circuit 10 of FIG. 1 have been tested. If so, then step 108 is executed, and an indication is provided that all of the banks 12 have been tested and have passed.

Should a determination be made during step 108 that not all of the RAM banks 12 have been tested, then step 110 is executed, and the next march element (that is, the next set of read/write operations to be performed) is read from the next successive location from a successive one of the march test registers $46_5$–$46_8$ in the register array 46 of FIG. 2. During initial execution of step 110, the first march element in the first march test register $46_5$ in the register array 46 is read.

The march test element read from the march test registers $46_5$–$46_8$ during step 110 is then examined (step 112) to determine whether the element is a null (i.e., a zero) or not. The presence of a null value indicates that all of the desired march test elements to be performed (i.e., all of the desired read/write operations) have already been performed. Under these conditions, the next RAM bank 12 is designated (step 104).

If the march test element read (during step 110) is not a null, then the address progression bit (bit 4) of the march test element is examined (step 114) to determine if the RAM addresses should be accessed in ascending or descending order. Should the RAM addresses be accessed in descending order (as reflected by a logic "1" level address progression bit), then the starting address is set at the highest address (N−1) of the current RAM bank 12 (step 116). Conversely, when the address progression bit is set at a "0" level, indicating that the addresses are to be accessed in ascending order, the starting address is set at the lowest order address (address=0) (step 118).

Figure 17:
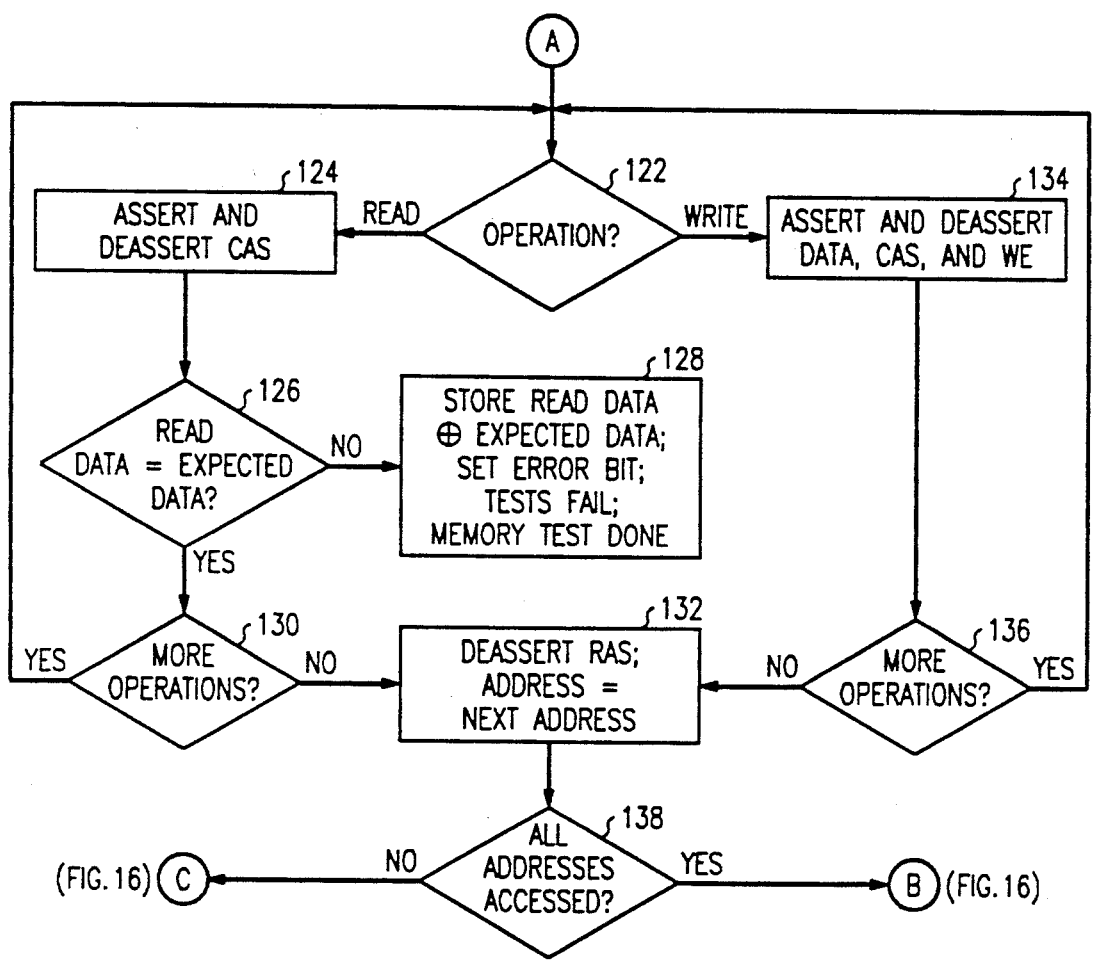

Once the starting address is set, then the RAS signal is asserted (step 120) to select the row of storage locations one of the RAM banks 12 which is to be accessed. Referring to FIG. 17, after the RAS signal is asserted, then a determination is made whether the then-active march test element requires a read or write operation (step 122). Should a read operation be required, then the CAS signal is asserted and then de-asserted (step 124) to select the column of the storage locations in one of the RAM banks 12 to be accessed. The assertion of the RAS and CAS signals causes the storage location lying in selected row and column, respectively, to be accessed for reading.

Once the RAM location lying in the selected row and column assested by the RAS and CAS signals, respectively, is accessed and the contents read, then a check is made (step 126) whether the data read from this location corresponds to the data expected to be read. Thus, if a "1" had previously been written into the accessed location, then, when the location is later read, a "1" should be present. If no match is found, then the data read from the accessed location is exclusively OR'd with the expected value, and the result is stored. At about the same time, an error bit is set in the error flag register $46_{17}$ of the register array 46 of FIG. 1 and in the appropriate status register in the register array 66 of FIG. 1 (step 128). As may be appreciated, the failure to obtain a match between the actual and expected data bits evidences a failure of the RAM banks 12.

Should the read data bit match the expected data bit during step 126, then a check is made (step 130) whether the currently active march test element requires additional read or write operations. If so, then step 122 is re-executed. Otherwise, the RAS signal is de-asserted and the next address to be accessed is fetched (step 132).

Rather than specifying a read operation, the currently active march test element may specify a write operation. Under these conditions, after checking to determine the nature of the operation to be performed during step 122, then the CAS signal is asserted and de-asserted, along with a write signal (WE). Thereafter, the data is written (step 134). In this way, data is written into the RAM location established by the asserted RAS and CAS signals. Following step 134, a check is made whether the currently active march test element requires additional read or write operations to be performed (step. 136). If so, then step 122 is re-executed; otherwise, step 132 is executed.

Following de-assertion of the RAS signal, and fetching of the next address during step 132, a check is made whether in fact all of the addresses in the RAM bank 12 have been accessed (step 138). If all of the addresses have been accessed (indicating that the currently-active march test element has, in fact, been fully performed), then step 110 of FIG. 16 is performed and another march test element is retrieved from the currently selected march test register. Otherwise, if all of the addresses have not been accessed for the currently active march test element, then step 120 of FIG. 16 is re-executed and an RAS signal is asserted for the next address.

When an error is found during execution of the march test described above, the location of the error is stored in the error address register $46_{17}$ in the register array 46 of FIG. 1, while the status register bits [31:29] in the status register $66_2$ of FIG. 12 record the identity of the RAM bank 12 in which the error occurred. To recover from this error, the error address, error status and error flag registers in the register array 46 are read as are the error data and status registers within the register array 66 of FIG. 1. These registers are then cleared. Recovery from single-bit and multiple memory-bit errors as well as data parity and address parity errors is similarly accomplished.

The foregoing describes a circuit 10 which accomplishes both control and testing of a plurality of banks 12 of RAMs $12_1$, $12_2$, $12_3$ . . . $12_n$.

It is to be understood that the above-described embodiments are merely illustrative of the principles of the invention. Various modifications and changes may be made thereto by those skilled in the art which will embody the principles of the invention and fall within the spirit and scope thereof.

I claim:

1. A circuit for controlling as well as testing an array of Random Access Memory devices (RAMs) comprising:

controller section means for: (a) establishing the density of each of the RAMs in the array, (b) storing at least one user-prescribed address indicative of a particular storage location in the array of RAMs, (c) accessing the particular storage location in the RAMs, and (d) initiating testing of the RAMs at selected intervals; and data path section means for: (a) storing data to be written to and read from the particular storage location in the RAMs, and (b) detecting errors in the RAMs during testing and normal operation.

2. The circuit according to claim 1 wherein the data path means includes means for correcting single-bit errors within the RAMs found during normal operation.

3. The circuit according to claim 1 further including interface means for coupling the controller section means and the data path section means to a four-wire boundary scan port.

4. The circuit according to claim 3 wherein the interface means comprises:

a Test Access Port (TAP) controller for generating control signals in response to externally supplied clock and test mode select signals;

a test data input signal bus for receiving externally generated information and commands;

an instruction register coupled to the TAP controller and to the test data access bus for storing signals generated by the TAP controller and for storing externally generated test data signals;

a decoder for decoding control signals stored in the instruction register;

a command register shared with the controller section means and coupled to the test input data bus for storing control commands received on said bus;

at least one march test register shared with the controller section means and coupled to the test data input bus for storing test commands;

a test error status register shared with the controller section means and coupled to the test data input bus for storing test status information;

a march test error data register shared with the data path section means and coupled to the test input data bus for storing information related to errors in the RAMs occurring during testing; and multiplexing and output-buffering means for first multiplexing the signals from the registers and then buffering the multiplexed signals; and a test data output bus coupled to the multiplexing and output buffering means for carrying the signal produced thereby.

5. The circuit according to claim 1 wherein the controller section means comprises:

an address queue for storing at least one user-prescribed address of a storage location in the RAMs;

addressing means coupled to the address queue for accessing the location in the RAMs corresponding to the user-prescribed address stored in the address queue;

a register array containing a plurality of registers for storing commands, status information, error data and user-prescribed test programs;

an operation code generator coupled to the register array for generating opcodes to control the operation of the controller section means;

a state machine coupled to the register array and the operation code generator for generating state signals to effectuate the operations commanded by the operation code generator; and march test initiation logic means coupled to the register array for initiating the user-prescribed test of the RAMs at selected intervals.

6. The circuit according to claim 5 wherein the march test initiation logic means comprises:

a temporary register for storing a user-prescribed test program received from the register array;

means coupled to the temporary register and the register array of the controller section means for shifting successive user-prescribed test programs from the register array into the temporary register;

means coupled to the temporary register for decoding the user-prescribed test program stored therein to initiate read and write operations on the RAMs to test the operation thereof; and address progression means for initiating successive accessing of the RAMs in a particular order in accordance with the user-prescribed test program stored in the temporary register.

7. The circuit according to claim 5 further including means for checking the parity of each address word stored in the address queue.

8. The circuit according to claim 1 wherein the data path section means comprises:

a write data queue for storing at least one data word to be written into the RAMs;

a read data queue for storing at least one data word read from the RAMs;

a check bit generator coupled to the write data queue for generating a check bit sum for each data word to be written into the RAMs;

a march test pattern generator and error detector for generating at least one user-prescribed test input word for input to the RAMs during a testing thereof and for analyzing a word read from the RAMs during testing to determine the correspondence thereof with the user-prescribed test input word; and error detector and corrector means coupled to the read data queue for analyzing data words read from the RAMs and for correcting any single-bit errors prior to storage of the read data word in the read data queue.

9. The circuit according to claim 8 further including means for checking the parity of each data word input to the write data queue.

10. A method for testing an array of Random Access Memory devices (RAMs) comprising the steps of:

(a) writing a first bit into a separate one of a plurality of preselected locations in the array of RAMs in advance of testing;

(b) reading each of the preselected locations in the array of RAMs to determine the presence of the first known bit and thereby determine the density of the RAMs in the array;

(c) addressing each successive location in the array of RAMs in accordance with the density of the RAMs;

(d) writing a second bit into each successive location in the array of RAMS;

(e) reading each successive location to ascertain the presence of the second bit;

(f) writing a third bit, having a logic state opposite of the second bit, into a successive one of the locations in the array of RAMs;

(g) reading each successive location to ascertain the presence of the third bit; and (h) recording the address of the location which, upon reading, is found not to contain the bit previously written therein.

11. The method according to claim 10 wherein the locations in the array of RAMs are addressed in ascending order.

12. The method according to claim 10 wherein the locations in the array of RAMs are addressed in descending order.

13. A method for testing an array of Random Access Memory devices (RAMs) comprising the steps of:

(a) writing a first bit into a separate one of a plurality of preselected locations in the array of RAMs;

(b) reading each of the preselected locations in the array of RAMs to determine the presence of the first known bit and thereby determine the density of the RAMs in the array;

(c) shifting out a successive one of a plurality of march test elements stored in a register, each march test element prescribing a particular set of write and read operations to be performed on a separate location in the array of RAMs, each write operation causing a bit to written into the storage location and each read operation causing the location to be read to determine if the bit written therein during the previous write operation is present;

(d) addressing each successive location in the array of RAMs;

(e) successively executing each of the read and write operations of the march test element on the addressed location;

(f) repeating steps (d) and (e) until the operations of the successive march test element have been performed on each location; and (g) recording the address of the location which, upon reading, is found not to contain the bit previously written therein.

14. A method for testing an array of Random Access Memory devices (RAMs) comprising the steps of:

(a) receiving, via a four wire Boundary-Scan bus, at least one user-defined march test element prescribing a particular sequence of read and write operations to be performed on each successive location in an array of RAMs, each write operation causing a bit of a particular state to be written into a memory location in the array and each read operation causing a memory location to be read to determine the presence of a particular bit written therein during a previous write operation;

(b) storing, in a first register, each user-defined march test element;

(c) shifting out a march test element stored in the first register and determining the sequence of write and read operations prescribed thereby;

(d) accessing each successive location in the array;

(e) successively executing each of the write and read operations of the march test element on the accessed location in the array;

(f) repeating the steps of (d) and (e) until each of the write and read operations of the march test element have been performed on each successive location in the array;

(g) recording, in a second register, information descriptive of errors in the RAM uncovered by executing the march test element; and (h) transmitting, across the four-wire boundary scan bus, information contained in the second register.

15. A circuit for controlling as well as testing an array of Random Access Memory devices (RAMs) comprising:

controller section means for: (a) storing at least one user-prescribed address indicative of a particular storage location in the array of RAMs, (b) accessing the particular storage location in the RAMs, and (c) initiating testing of the RAMs at selected intervals;

data path section means for: (a) storing data to be written to and read from the particular storage location in the RAMs, and (b) detecting errors in the RAMs during testing and normal operations; and interface means for interfacing the controller section means and data section path means to a four-wire Boundary-Scan port so that information can be communicated to and from the data path section means and controller section means via the four-wire Boundary-Scan port.

* * * * *